United States Patent [19]

Fisher et al.

[11] Patent Number: 5,200,391
[45] Date of Patent: Apr. 6, 1993

[54] METHOD AND APPARATUS FOR FABRICATING A MULTIFILAMENTARY WIRE

[75] Inventors: Michael V. Fisher, San Diego; Kurt M. Schaubel, Cardiff; Lawrence D. Woolf, Carlsbad; Robert A. Olstad, San Diego; William A. Raggio, Del Mar, all of Calif.

[73] Assignee: General Atomics, San Diego, Calif.

[21] Appl. No.: 587,230

[22] Filed: Sep. 24, 1990

[51] Int. Cl.⁵ .......................................... H01B 12/00
[52] U.S. Cl. ................................ 505/1; 29/599; 228/4.1; 228/179; 505/704; 505/927
[58] Field of Search ............... 228/148, 179, 200, 122, 228/124, 173.7, 248, 4.1; 29/599; 505/704, 917, 927, 887, 1

[56] References Cited

U.S. PATENT DOCUMENTS

| | | | |
|---|---|---|---|
| 3,755,886 | 9/1973 | Hermann | 228/201 |
| 4,197,154 | 4/1980 | Pfaff, Jr. | 156/47 X |
| 4,454,380 | 6/1984 | Turowski | 29/599 X |
| 4,606,495 | 8/1986 | Stewart | 228/248 X |
| 4,990,490 | 2/1991 | Pathare | 228/179 X |
| 4,994,633 | 2/1991 | Puhr | 29/599 X |

OTHER PUBLICATIONS

Shimamoto et al 6th International Conference on Magnetic Technology; Bratislava, Czechoslovakia (Aug. 29-Sep. 2, 1977); pp. 1002-1006.

Manko *Solders & Soldering* McGraw Hill Book Co. New York, N.Y. (1979); pp. 28-29 and 186-187.

*Primary Examiner*—Kenneth J. Ramsey
*Attorney, Agent, or Firm*—Nydegger & Associates

[57] ABSTRACT

A process for joining ceramic superconductor fibers with a channel to fabricate a superconductor wire includes concertedly drawing the fibers and the channel together to feed the fibers into the channel. A flowable solder paste is continuously dispensed into the channel over the fibers. The combination of channel, fibers and solder paste is then subjected to a rapid rise in temperature which melts the solder. The molten solder is then frozen to encase the fibers in the solder and attach the solder to the channel to create a superconductor wire.

11 Claims, 3 Drawing Sheets

METHOD AND APPARATUS FOR FABRICATING A MULTIFILAMENTARY WIRE

FIELD OF THE INVENTION

The present invention pertains generally to superconductor wires. More specifically, the present invention pertains to methods and apparatus for combining several superconductor filaments in a support substrate. The present invention is particularly, but not exclusively, useful in the manufacturing of a bendable superconductor cable which is made of high temperature superconductor ceramic materials.

BACKGROUND OF THE INVENTION

With the advent of superconductor materials which have superconducting transition temperatures (Tc) above about 20 Kelvins, there has arisen the possibility of highly efficient transmission of electrical power, i.e., transmission of electrical power with substantially no transmission losses. This potential, however, is very much dependent on the ability to provide a structure which will support and protect relatively long superconductor wires and transmission cables which are typically made of a bundle of individually manufactured high-Tc superconductor filaments.

Unfortunately, presently known high-Tc superconductor materials are ceramics which are relatively brittle and fragile. Furthermore, they are particularly susceptible to breakage when subjected to tensile stresses, as compared to compressive stresses. Consequently, the structural limitations of ceramic superconductor materials are most apparent when any bending (and, hence, potential tensioning) of the superconductor may be necessary, as is commonly required in a wide variety of potential applications.

To avoid imposing undue tensile stress on the ceramic filaments of a superconductor cable when the cable is bent, it is desirable to support the cable in a structure which has a larger cross-sectional area than the cable. More specifically, it is well-known that when a structure is bent, portions of the structure will be in tension and other portions of the structure will be in compression. Accordingly, when a structure which has a larger cross-sectional area than the ceramic superconductor cable is used to support the cable, the superconductor cable can effectively be positioned in that portion of the bendable support structure which will be subjected only to compressive stresses. As stated above, modern ceramic superconductors can withstand compression more readily than they can withstand tension. Accordingly, it is necessary to form the cable into a relatively flat layer of coparallel superconductor filaments, so that the cable will fit into the desired portion of the supporting structure.

Moreover, it will be appreciated that the superconductor material cannot simply be placed onto the substrate, but must be bonded to the substrate. Unfortunately, not just any bonding technique can be used, because the superconductor material can easily be mechanically or chemically damaged during the bonding process.

In light of the above, it is an object of the present invention to provide a method and apparatus for manufacturing a superconductor wire from ceramic superconductor filaments in which the filaments are aligned into a coparallel, juxtaposed relationship with other filaments in the wire. Further, it is an object of the present invention to provide a method and apparatus for manufacturing a superconductor wire from ceramic superconductor filaments without causing undue chemical or mechanical damage to the ceramic superconductor when the superconductor is attached to a support substrate. Another object of the present invention is to provide a method and apparatus for manufacturing a superconductor wire from ceramic superconductor filaments which produces a wire that can be effectively bent and yet still maintain the superconducting element in a state of compression in order to minimize the possibility of cracking or breaking the superconducting element. A further object of the present invention is to provide a method and apparatus for manufacturing a superconductor wire from ceramic superconductor filaments which can automatically and continuously process the filaments into the wire. Still another object of the present invention is to provide a method and apparatus for manufacturing a superconductor wire which is relatively easy to use and comparatively cost effective.

SUMMARY

An apparatus for manufacturing a bend-tolerant superconductor wire from a plurality of several (e.g., six or twelve) silver coated superconductor filaments in a continuous process includes a backboard and a number of motor-driven supply spools. Each of the supply spools is rotatably mounted on the backboard, and each of the supply spools holds one end of an individual superconductor filament. The respective opposite ends of the filaments (i.e., the ends of the filaments which are not held on an associated supply spool) are collectively attached to a single rotatable wire take-up spool. Accordingly, the wire take-up spool can be rotated to transfer the silver coated filaments from the respective supply spools to the take-up spool. Between the supply spool and the take-up spool are various devices for effectively joining the individual filaments to form a superconductor wire.

To help fabricate the superconductor wire, the apparatus of the present invention includes a combiner board. This combiner board is mounted on the backboard between the supply spools and the wire take-up spool and is positioned substantially normal to the backboard. One surface of the combiner board is formed with a guide channel which is tapered inwardly toward the supply spools, i.e., the channel is incrementally enlarged away from the supply spools to the take-up spool. A series of curved, elongated grooves is also formed on the combiner board, and each groove extends from the guide channel toward the backboard. More particularly, the grooves of the combiner board are sequentially aligned on the surface of the combiner board for individually receiving one of the silver coated superconductor filaments and feeding the respective superconductor filament into the guide channel to form a layer of superconductor material.

Additionally, each supply spool has a tension controller individually associated with the respective supply spool. In accordance with the present invention, each of the tension controllers engages the superconductor filament that is associated with the respective supply spool and establishes a predetermined tension in the filament as the filament is being transferred from the filament's associated supply spool to the take-up spool.

Further, the present apparatus includes a support substrate supply spool which holds a support substrate that is preferably a U-shaped channel. More specifically, the channel is made of an electrically conducting material and includes a flat broadened base with a pair of mutually opposed and substantially parallel sidewalls which extend outwardly from the base to form the channel. Additionally, the support wire take-up spool is rotated, both the support substrate and the superconductor filaments are drawn toward the take-up spool. A roller is positioned on the apparatus between the combiner board and the take-up spool to guide the layer of superconductor filaments into the channel of the support substrate.

A solder paste dispenser is positioned between the roller and the take-up spool, and a furnace through which the support substrate with superconductor layer is drawn is positioned between the solder paste dispenser and the take-up spool. For purposes of the present invention, the furnace can be a series of hot plates or heating lamps which are arranged to provide the necessary heating stages for proper processing of the solder paste which is to be deposited into the channel over the superconductor filaments. As the support substrate with superconductor layer is drawn past the solder paste dispenser, the solder paste dispenser deposits a flowable solder paste having a flux constituent and a metal solder constituent into the channel of the support substrate and around the superconductor layer.

While solder paste is being dispensed onto the superconductor layer positioned in the support substrate as this combination is drawn past the dispenser, other portions of the support substrate with superconductor layer that have had solder paste dispensed thereon are drawn through the furnace. The furnace heats the solder paste to melt the solder and activate its flux to clean the metallic surfaces of the silver coated superconductor layer, the channel and the metal solder. Also, this heating is intended to rapidly disassociate the flux from the molten solder. The solder is then frozen in a cooling chamber of the furnace and the dissociated flux is washed off of the superconductor wire with hot water. In accordance with the present invention, the superconductor wire that is produced by the apparatus of the present invention has a layer of superconductor material which is soldered into the channel of a U-shaped support substrate.

Importantly, to permit the wire to be incrementally bent without damaging the superconductor material of the wire, the support substrate preferably has a higher modulus of elasticity than does the solder. Consequently, any bending of the wire wherein the base of the channel is more radially outward than the solder from the center of curvature of the bend will tend to confine tensile stresses on the base of the channel portion of the wire. On the other hand, the solder, and hence the superconductor layer, can be maintained in a state of compression during such bending. Finally, additional protection for the wire and the superconductor layer encased in the solder filler can be provided by a shroud which is wrapped around the structure. More specifically, a shroud made of insulating tape can be used.

A method for manufacturing a bend-tolerant superconductor wire using the apparatus described above is also disclosed.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
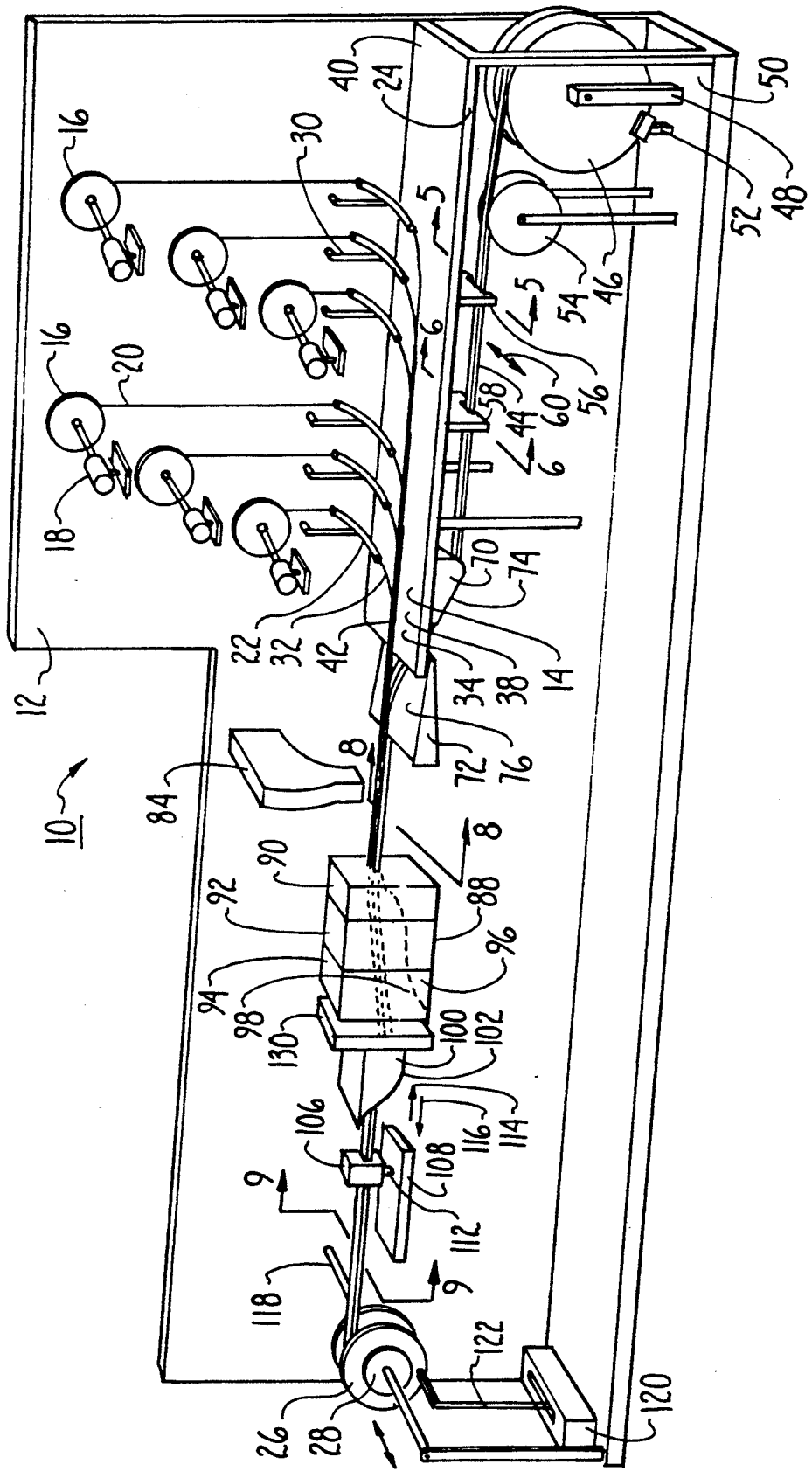
FIG. 1 is a perspective view of the novel apparatus for manufacturing a superconductor wire of the present invention, with portions shown in phantom for clarity.

Referring initially to FIG. 1, an apparatus for aligning superconductor wires is shown, generally designated 10. Apparatus 10 includes a backboard 12 and a combiner board 14. As shown, combiner board 14 is attached to or mounted on backboard 12 substantially orthogonally to backboard 12. A plurality of supply spools 16 are also shown mounted on backboard 12. It is to be understood that supply spools 16 are rotatably mounted on backboard 12, and that each spool 16 can be rotated by a respective motor 18. It is to be further understood that while FIG. 1 shows six (6) supply spools 16, apparatus 10 can include a greater or lesser number of supply spools 16. For example, twelve (12) supply spools 16 can be mounted on backboard 12, if desired.

As shown in FIG. 1, each supply spool 16 is attached to a respective superconductor filament 20. Each superconductor filament 20 can be made of any suitable superconductor material which has a superconducting transition temperature above about twenty (20) Kelvins. In the preferred embodiment, each superconductor filament 20 is made of a superconductor material which has the chemical formula $REBa_2Cu_3O_{7-x}$, where RE is selected from the group consisting of yttrium and elements having an atomic number between fifty seven (57) and seventy one (71), inclusive, and x is from zero (0) to one half (0.5). inclusive. If desired, each filament 20 can have a nickel-based support substrate and a silver-based protective overcoating. Such a superconductor filament 20 is fully disclosed in co-pending U.S. patent application entitled "Process and Apparatus for Fabrication of Silver-Coated High Temperature Ceramic Superconductor Wire", assigned to the same assignee as the present invention.

Still referring to FIG. 1, each superconductor filament 20 is shown extending through a respective curved hollow guide tube 22. Each guide tube 22 is curved outwardly from backboard 12, i.e., each guide tube 22 is curved from backboard 12 toward edge 24 of combiner board 14. Also, each guide tube 22 is curved from backboard 12 toward a rotatable motor-driven take-up spool 26. Take-up spool 26 is operatively associated with a drive motor 28. The guide tubes 22 receive the respective filaments 20 through the respective lumens of the guide tubes 22. The respective lumens of the guide tubes 22 can be coated with Teflon.

Additionally, as shown in FIG. 1, the guide tubes 22 are fixedly attached to respective wire transfer controllers 30. The wire transfer controllers 30 are any suitable devices which can sense the tension in the associated filament 20 and, in response to the tension of the filament 20, control the operation of the respective supply spool motor 18 to control the speed of rotation of the associated spool 16 and, hence, to establish a predetermined tension in the respective filament 20. An example of a suitable device which can be used for wire tension controller 30 is fully disclosed in co-pending U.S. patent application entitled "Low Tension Wire Transfer System", assigned to the same assignee as the present invention.

Figure 2:
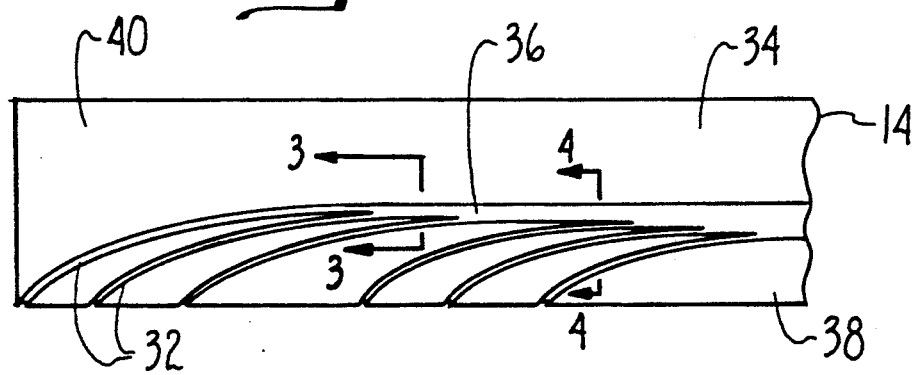
FIG. 2 is a top view of a portion of the combiner board of the novel apparatus for manufacturing a superconductor wire of the present invention.

In cross-reference to FIGS. 1 and 2, it can be appreciated that guide tubes 22 guide the respective filaments 20 into respective elongated curved grooves 32, which are formed on surface 34 of combiner board 14. More particularly, curved grooves 32 receive their respective filaments 20 and are gently curved to feed the respective filaments 20 into alignment in guide channel 36. It will be understood that radius of curvature of the grooves 32 is relatively large, in order to avoid undue bending stresses on the potentially brittle filaments 20.

Figure 3:
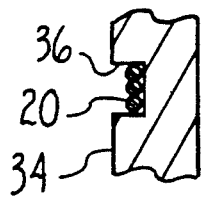
FIG. 3 is a cross-sectional view of a portion of the combiner board of the novel apparatus for manufacturing a superconductor wire of the present invention, as seen along the line 3—3 in FIG. 2 with portions broken away for clarity.
Figure 4:
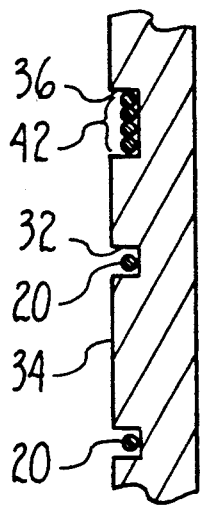
FIG. 4 is a cross-sectional view of a portion of the combiner board of the novel apparatus for manufacturing a superconductor wire of the present invention, as seen along the line 4—4 in FIG. 2 with portions broken away for clarity.

As shown best in FIG. 2, guide channel 36 is incrementally enlarged, i.e., widened, to accommodate each of the filaments 20 as the filaments 20 are individually fed into channel 36. Stated differently, channel 36 is tapered inwardly from end 38 of combiner board 14 toward end 40 of combiner board 14. As shown in cross-reference to FIGS. 2, 3, and 4, channel 36 guides the filaments 20 into co-parallel alignment. In other words, channel 36 guides the filaments 20 into a layer 42. It is to be understood in reference to FIGS. 3 and 4 that filament layer 42 is a coplanar array of filaments 20. The combiner board and tension control system described above are fully disclosed in co-pending U.S. patent application entitled "Fiber Combiner", and assigned to the same assignee as the present invention.

Figure 5:
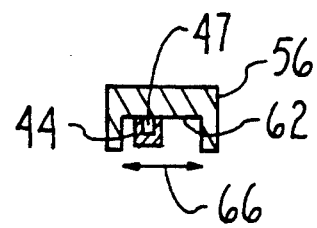
FIG. 5 is cross-sectional view of one support substrate guide of the novel apparatus for manufacturing a superconductor wire of the present invention, as seen along the line 5—5 in FIG. 1.
Figure 6:
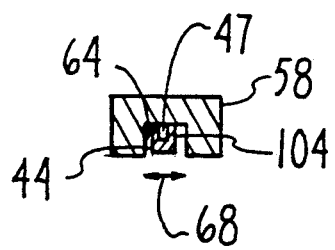
FIG. 6 is cross-sectional view of one support substrate guide of the novel apparatus for manufacturing a superconductor wire of the present invention, as seen along the line 6—6 in FIG. 1.

Referring back to FIG. 1, a support substrate 44 is shown attached to a support substrate supply spool 46 and to take-up spool 26. As shown best in FIGS. 5 and 6, substrate 44 has a flattened U-shaped channel 47. Substrate 46 is made of an electrically conducting material which has a relatively high modulus of elasticity. Preferably, substrate 46 is made of hard copper.

Referring back to FIG. 1, substrate supply spool 46 is rotationally attached to a mount 48, and mount 48 is in turn attached to a base plate 50. As shown in FIG. 1, a brake 52 can be positioned next to substrate supply spool 46 to establish a predetermined speed of rotation of spool 46 as take-up spool 26 draws substrate support 44 through apparatus 10. Thus, brake 52 can establish a predetermined tension on substrate support 44.

FIG. 1 also shows that substrate support 44 is positioned against the periphery of a roller 54. Roller 54 is rotationally attached to apparatus 10 for rolling engagement with support substrate 44. As further shown in FIG. 1, support substrate 44 also passes through guides 56 and 58. It is to be appreciated that support substrate 44 is spooled onto support spool 46 in juxtaposed coils. Consequently, as support substrate 44 is unspooled, substrate 44 moves back and forth laterally with respect to apparatus 10, i.e. in the directions indicated by arrows 60. It is preferable, however, that substrate 44 follow a substantially straight path as it is drawn through apparatus 10, to facilitate the manufacturing steps disclosed below. Accordingly, guides 56 and 58 guide support substrate 44 into a substantially straight path. To do this, guides 56 and 58 are respectively formed with guide troughs 62, 64, as respectively shown in FIGS. 5 and 6. As seen in cross-reference to FIGS. 1, 5 and 6, trough 62 of guide 56, which is the guide closest to substrate supply spool 46, has a width 66 which is greater than the width 68 of trough 64 of guide 58. Consequently, support substrate 44 is drawn through progressively narrower guide troughs 62, 64 as substrate 44 is unspooled from substrate support spool 46. While FIG. 1 shows only two guides 56, 58, it is to be understood that additional guides which have progressively narrower troughs may be positioned on apparatus 10 between guide 58 and inclined ramp 70.

Referring back to FIG. 1, curved ramps 70, 72 are shown attached to apparatus 10 for the purpose of guiding support substrate 44 into juxtaposition with superconductor layer 42. Stated differently, curved ramps 70, 72 guide the U-shaped channel 47 of substrate support 44 against the layer 42 of superconductor material as the layer 42 and the substrate 44 are drawn through apparatus 10 by take-up spool 26. It is to be appreciated that the radii of curvature of the surfaces 74, 76 of respective curved ramps 70, 72 are relatively large, in order to gently guide layer 42 and substrate 44 into juxtaposed contact.

Figure 7:
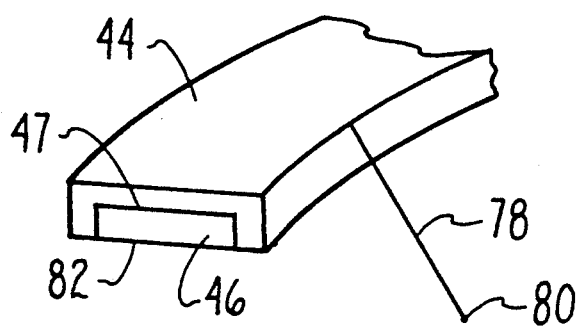
FIG. 7 is a cut-away perspective view of the support substrate and superconductor layer manufactured in accordance with the present invention, before soldering.

It is to be appreciated with respect to the above discussion that superconductor layer 42 is positioned within channel 47 of support substrate 44 on the side of the neutral plane of bending of substrate 44 which is in compression. More specifically, as will be readily appreciated by the skilled artisan, whenever a device, apparatus or structure, such as substrate 44, is bent in a manner as shown in FIG. 7, both tension and compression stresses are imposed on the structure. More specifically, when substrate 44 is bent with a radius of curvature 78 around a center of curvature 80 as shown in FIG. 7, it will be understood that the portion of substrate 44 which is more outwardly radial from the center of curvature 80 will be in tension and the inwardly radial portion will be in compression. In accordance with the intent of the present invention, the superconductor layer 42 will be located in the zone of compression 82 when substrate 44 is bent as shown in FIG. 7. For the present invention this condition is made more attainable by the fact that substrate 44 is made of a material, such as hard copper, which has a relatively high modulus of elasticity.

FIG. 1 also shows that a solder dispenser 84 is attached to apparatus 10. In cross-reference to FIGS. 1 and 8, dispenser 84 dispenses a flowable solder paste 86 having appropriate metal solder, binder and flux constituents into U-shaped channel 47 (and, hence, onto superconductor layer 42.) It is to be appreciated that flowable solder paste 86 can actually be something other than a paste. For example, powdered solder or a solder tape (not shown) could be used. Preferably, however, solder paste 86 is of a type which is commercially available and which has a metal solder constituency indicated by the formulation Sn62-Pb36-Ag2. This composition minimizes leaching of silver when soldering a silver-coated superconductor layer 42. Additionally, the metal solder material disclosed above has a relatively low melting point. Thus, the potential for thermally damaging superconductor layer 42 is reduced. For purposes of the present invention the flux may be either an organic acid, and inorganic acid, or a rosin-based flux. Preferably, the flux is organic acid-based whose residue is water soluble.

Figure 8:
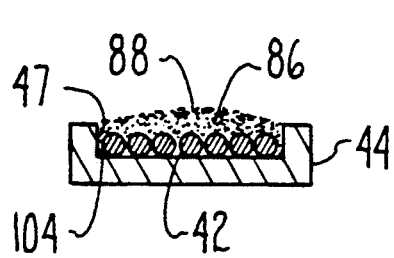
FIG. 8 is a cross-sectional view of the superconductor wire manufactured in accordance with the present invention after the solder has been dispensed on the support substrate, as seen along the line 8—8 in FIG. 1.

As further shown in FIG. 8, it is preferred that sufficient solder paste 86 be gently dispensed into channel 47 of support substrate 44 for the solder paste 86 to create a mound 88 of paste 86, in order to provide sufficient material with which to bind superconductor layer 42 to substrate 44 after the combination has been subjected to subsequent processing steps. Accordingly, it will be appreciated by the skilled artisan that the rate at which solder paste 86 is dispensed onto substrate 44 will be established as appropriate for the speed at which substrate 44 (and, hence, layer 42) is drawn through apparatus 10.

FIG. 1 further shows that after solder paste 86 has been dispensed onto superconductor layer 42 in the channel 47 of support substrate 44, the substrate 44 with layer 42 and solder paste 86 is passed through a furnace 88. For purposes of the present invention, furnace 88 must be capable of heating the solder paste 86 in at least three identifiable time/temperature stages. As shown in FIG. 1, furnace 88 includes a heating chamber 90 in which the solder paste 86 is preheated to drive the volatile components that are in solder paste 86. Furnace 88 also has a heating chamber 92 in which the solder paste is rapidly heated to first activate the flux in paste 86 and then melt the solder. Furnace 88 also has a cooling chamber 94 in which the liquid solder material that remains in channel 47 is frozen.

FIG. 1 also shows that furnace 88 includes a guide 96 which has a surface 98 that is slightly curved. Also, a guide 100 with slightly curved surface 102 is mounted on apparatus 10. Substrate 44 with superconductor layer 42 must pass over the surfaces 98, 102. Consequently, the guides 96, 100 provide a curved path which substrate 44 must follow as it passes through the furnace 88. The purpose for this curved path is to establish a force against the fibers which is normal to the axis of elongation of substrate 44 to counter buoyant forces from the molten solder and thereby restrain layer 42 near the bottom 104 of substrate 44, shown in FIG. 8. One solder dispenser and furnace which may be used as dispenser 84 and furnace 88 is disclosed in co-pending U.S. patent application entitled "Process for Soldering Superconducting Fibers into a Copper Channel", which is assigned to the same assignee as the present invention.

Still referring to FIG. 1, a shroud dispenser 106 is shown rollably engaged with a platform 108 of apparatus 10 for the purpose of wrapping a shroud 110 (shown in FIG. 9) around the soldered substrate 44 with layer 42. More particularly, dispenser 106 is mounted on roller 112, which is rollably engaged with platform 108. Dispenser 106 is rollably mounted on platform 108 to facilitate replenishing shroud 110 material within dispenser 106 when the shroud 110 material within dispenser 106 is exhausted, without having to stop substrate 44. More particularly, dispenser 106 can roll on platform 108 so that dispenser 106 can advance in the direction indicated by arrow 114 while wrapping the soldered substrate 44 (which is moving through apparatus 10 in the direction indicated by arrow 116) with shroud 110. When the shroud 110 material within dispenser 106 is exhausted, dispenser 106 can be replenished while dispenser 106 is being retracted in the direction of arrow 116 at a faster speed than the speed with which substrate 44 is moving through apparatus 10 in the direction of arrow 116. Once shroud dispenser 106 has been replenished with shroud 110 material, dispenser 106 can again position shroud 110 around the unwrapped portion of substrate 44 which has "caught up" with dispenser 106. It is to be understood that shroud 110 is preferably an electrical insulator, for example, an electrically insulating tape.

Lastly, FIG. 1 shows that take-up spool 26 is rotatably attached to apparatus 10. Spool 26 can be rotated by motor 28. Also, to facilitate winding soldered substrate 44 with superconductor layer 42 around the periphery of spool 26, spool 26 can be axially moved along shaft 118 motor 120 through linkage 122. It is to be appreciated that spool 26 is axially moved back and forth along shaft 118 at a speed which is appropriate for establishing the desired pitch of successive coils of soldered substrate 44 with layer 42 on spool 26. It will be further appreciated that by axially moving spool 26 to spool substrate 44 onto spool 26, undue lateral bending of substrate 44 is avoided.

OPERATION

In the operation of apparatus 10, reference is made to FIG. 1. It is to be understood that in the operation of apparatus 10, the filaments 20 are continuously drawn from the respective supply spools 16. Accordingly, successive portions of the filaments 20 are aligned by combiner board 14 and then soldered in support substrate 44.

More specifically, take-up spool 26 is rotated at a predetermined speed by motor 28. Accordingly, the individual filaments 20 through their respective guide tubes 22 onto combiner board 14. As the filaments 20 are drawn onto combiner board 14, the respective grooves 32 guide the filaments 20 into alignment to form the filament layer 42. Simultaneously, substrate 44 is drawn from substrate support spool 46 into juxtaposition with superconductor layer 42. Successive portions of layer 42 are consequently positioned into respective successive portions of the channel 47 of support substrate 44.

Those portions of substrate 44 which have been juxtaposed with layer 42 are drawn under solder dispenser 84. As disclosed above, solder 86 is deposited onto portions of layer 42 and support substrate 44 which are drawn beneath dispenser 84.

As also disclosed above, successive portions of substrate 44 with layer 42 on which solder 86 has been deposited are drawn through furnace 88. The specific heating stages which are accomplished within furnace 88 are best appreciated with reference to FIG. 10. In cross-reference to FIGS. 1 and 10, it will be appreciated that substrate 44 with solder paste 86 enters pre-heating chamber 90 of furnace 88 at an initial time $t_0$ and an initial temperature $T_1$ (i.e. room temperature). In chamber 90, solder paste 86 is heated from room temperature ($T_1$) to a temperature $T_2$ which is approximately one hundred thirty degrees centigrade (130° C.). The heating stage of substrate 44 with superconductor layer 42 that is accomplished in chamber 90 is designated 90' in FIG. 10. The temperature $T_1$ is below the flux activation temperature of the solder paste 86. As shown by the curves 124, the transition from $T_1$ to $T_2$ within chamber 90 can be accomplished at any of several rates. In any case, the temperature $T_2$ is held for any period of time that is necessary to remove the volatile components from solder paste 86.

Figure 10:
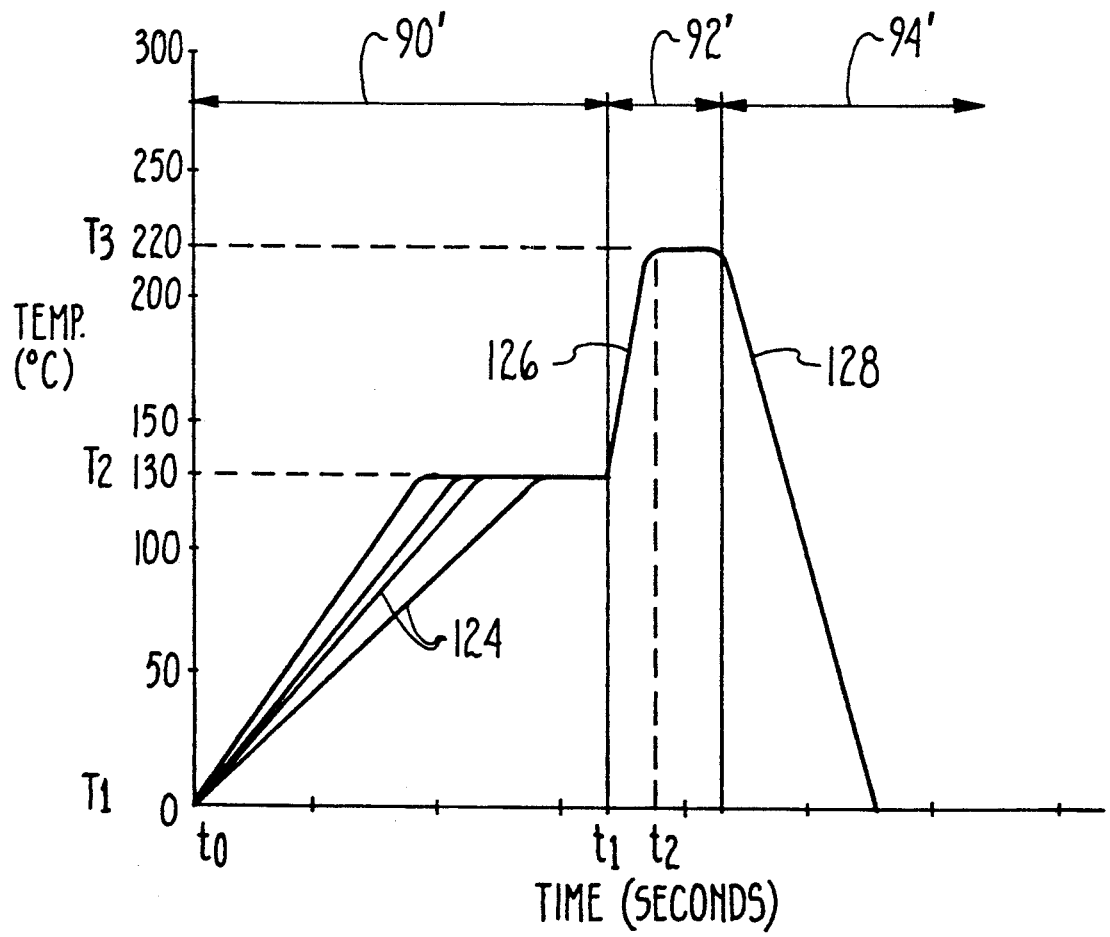
FIG. 10 is a temperature vs. time diagram of the heating stages for manufacturing a superconductor wire in accordance with the present invention.

The duration of the time at which substrate 44 with solder paste 86 is heated to above $T_1$ in chamber 92, which heating stage begins at time $t_1$ in FIG. 10 and is designated 92', can be critical. Specifically, with solder paste 86 at the temperature $T_2$, a relatively rapid rise in temperature is initiated at time $t_1$. Preferably, this rapid rise in temperature is made at a rate which is approximately equal to fifty (50) degrees centigrade per second. During this rise in temperature, the flux in solder paste 86 is activated as the temperature of the solder paste 86 passes above the flux activation temperature, which is typically approximately one hundred fifty degrees centigrade (150° C.). This activation of the flux causes the flux in solder paste 86 to clean the metal components being heated. As the temperature of the solder paste continues to rise, the metal solder material of solder paste 86 melts and the less dense flux in solder paste 86 will rise and float on the molten solder material of solder 86. Specifically, this separation or disassociation of the flux from the solder paste 86 becomes effective at approximately one hundred eighty degrees centigrade (180° C.), which is the approximate melting point of the solder.

With further reference to FIG. 10, it will be appreciated that the temperature rise from $T_2$ to a temperature in the range of $T_3$, as indicated by the curve 126, is accomplished in the time interval between $t_1$ and $t_2$ during heating stage 92'. Preferably, this time interval is on the order of one to ten seconds and preferably on the order of about two seconds (2 secs.). Importantly, the activated flux must be quickly removed from contact with the silver coated superconductor material of layer 42, in order to minimize the possibility that the activated flux will corrode or otherwise damage the superconductor filaments 20.

During the second stage 92, the temperature of the combination which now includes superconductor layer 42, substrate 44, and solder 86 is maintained for a period of about one to ten seconds at $T_3$ to facilitate the flow of solder around layer 42 in substrate 44. Then, in stage 94', which is accomplished in chamber 94, the temperature is rapidly lowered in one to five seconds from $T_3$ to a temperature below the melting point of the solder. Consequently, the time during which the liquified solder is in contact with superconductor layer 42 (and the concomitant corrosive effects of the liquid solder on the superconductor layer 42) is minimized. As indicated by the curve 128, this cooling can be accomplished fairly rapidly, and will eventually return soldered substrate 44 with superconductor layer 42 to room temperature. Effectively, after the completion of third stage 94', solder paste 86 has been converted to a solidified solder and the flux residue (not shown) which was separated from solder paste 86 lies on top of the solidified solder. This flux is removed as soldered substrate 44 with layer 42 is drawn through a scrubber 130, shown in FIG. 1. Depending on the type of flux to be removed, scrubber 130 provides a hot water rinse or solvent rinse to remove the flux from soldered substrate 44 with superconductor layer 42. Finally, soldered substrate 44 with layer 42 is drawn through shroud dispenser 106, where shroud 110 is wrapped around substrate 44 with layer 42 to form superconductor wire 132.

Figure 9:
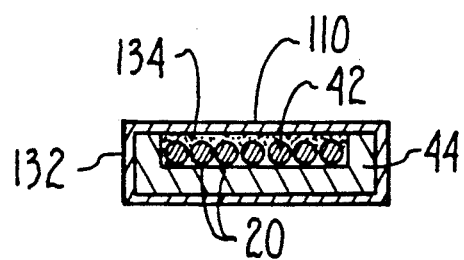
FIG. 9 is a cross-sectional view of the superconductor wire manufactured in accordance with the present invention after the shroud has been wrapped around the wire, as seen along the line 9—9 in FIG. 1.

As seen best in FIG. 9, wire 132 is substantially flat and has a substantially rectangular cross section. Importantly, the superconductor filaments 20 are completely encased or surrounded by solidified solder 134 to protect the superconductor filaments 20, and the solder 134 has attached to the substrate 44 to hold and support the superconductor fibers 20 on substrate 44.

It is to be understood in reference to the abovedisclosed process that successive portions of filaments 20 are continuously drawn through apparatus 10 to be aligned into layer 42, that successive portions of layer 42 are in turn continuously fed into substrate 44, and that successive portions of substrate 44 with superconductor layer 42 are consequently continuously drawn through the soldering components described above. Accordingly, the various components of wire 132 are preferably drawn through apparatus 10 by take-up spool 26 at a substantially constant rate. Therefore, chambers 90, 92, and 94 of furnace 88 are dimensioned as appropriate for establishing the temperature profile of substrate 44 with layer 42 and solder paste 86 shown in FIG. 10.

While a particular method and apparatus for fabricating a multifilamentary wire as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. An apparatus for manufacturing a bend-tolerant superconductor wire having an electrically conductive support substrate and a plurality of superconductor filaments, which comprises:
    means for aligning said filaments into a layer of superconductor material comprising a backboard;
    a plurality of supply spools rotatably mounted on said backboard, each of said supply spools holding one of said superconductor filaments;
    a plurality of movable wire transfer controllers, each of said controllers being mounted on said backboard to individually engage with one of said superconductor filaments from said respectively associated supply spool to establish a preselected orientation for said controllers;
    means for generating a signal representative of the deviation of said controller from said preselected orientation;
    a plurality of drive means each electrically connected with a respective signal generating means and operatively connected with a respective said supply spool for rotating said respective supply spool in response to said signal;

a combiner board having a surface formed with a guide channel and a plurality of curved grooves integrally extending therefrom, each of said grooves sequentially aligned on said surface for individually receiving one of said superconductor filaments and feeding said superconductor filament into said guide channel means for positioning said layer on said substrate;

means for uniformly moving said layer together with said substrate at a preselected speed;

means for dispensing a flowable solder paste having a flux constituent and a solder metal constituent onto said moving substrate to cover said layer with said solder paste;

means for heating said solder paste to activate said flux and melt said solder metal to surround said layer with said solder; and means for freezing said solder to encase said superconductor layer in said solder and attach said solder to said substrate.

2. A device as recited in claim 1 wherein said guide channel is incrementally enlarged to accept and accommodate said superconductor filaments in a juxtaposed relationship as each of said superconductor filaments is fed into said guide channel.

3. An apparatus as recited in claim 1 wherein said substrate is a U-shaped channel.

4. A device as recited in claim 3 wherein said U-shaped channel is defined by a pair of mutually opposed and substantially parallel sidewalls and a base, said sidewalls being joined to said base and extending therefrom, said U-shaped channel so configured to receive said layer of superconductor material therein.

5. An apparatus for encasing a plurality of superconductor filaments in an electrically conductive structure having a channel for receiving said filaments to form a superconductor wire, which comprises:

a backboard;

a plurality of filament supply spools rotatably mounted on said backboard, each of said filament supply spools holding one of said superconductor filaments;

a combiner board attached to said backboard for sequentially receiving each of said filaments and aligning said filaments into a layer of superconductor material;

a rotatable take-up spool attachable to each of said filaments to draw said filaments from respective said filament supply spools along said combiner board to said take-up spool;

means for positioning said layer into said channel of said structure;

a solder dispenser positioned adjacent said channel of said structure for dispensing a flowable solder having a flux constituent and a solder metal constituent into said channel of said structure;

means for heating said flowable solder to melt said solder metal to surround said filaments with said molten solder; and means for freezing said solder to encase said filaments in said solder and attach said solder to said structure.

6. An apparatus as recited in claim 5 further comprising:

a plurality of movable wire transfer controllers, each of said controllers being mounted on said backboard to individually engage with one of said superconductor filaments from said respectively associated filament supply spool to establish a preselected orientation for said controllers;

means for generating a signal representative of the deviation of said controller from said preselected orientation; and a plurality of drive means each electrically connected with a respective signal generating means and operatively connected with a respective said supply spool for rotating said respective filament supply spool in response to said signal.

7. A device as recited in claim 5 wherein said combiner board has a surface formed with a guide channel and a plurality of curved grooves integrally extending therefrom, each of said grooves sequentially aligned on said surface for individually receiving one of said superconductor filaments and feeding said superconductor filament into said guide channel.

8. A device as recited in claim 7 wherein said guide channel is incrementally enlarged to accept and accommodate said superconductor filaments in a juxtaposed relationship as each of said superconductor filaments is fed into said guide channel.

9. A device as recited in claim 5 wherein said channel of said structure is defined by a pair of mutually opposed and substantially parallel sidewalls and a base, said sidewalls being joined to said base and extending therefrom to establish a U-shaped configuration for receiving said layer of superconductor material therein.

10. An apparatus as recited in claim 5 wherein said heating means comprises a furnace having a curved guide surface positioned therein to provide a curved heating path through said furnace for said structure containing said layer.

11. An apparatus as recited in claim 5 further comprising a structure supply spool holding said structure, wherein said structure supply spool and said plurality of filament supply spools are positioned on opposite sides of said combiner board respectively, such that said layer and said structure approach said positioning means at an acute angle to one another.

* * * * *